(12) United States Patent
Hongoh et al.

(10) Patent No.: US 6,358,324 B1
(45) Date of Patent: Mar. 19, 2002

(54) MICROWAVE PLASMA PROCESSING APPARATUS HAVING A VACUUM PUMP LOCATED UNDER A SUSCEPTOR

(75) Inventors: Toshiaki Hongoh, Nakakoma-Gun; Tetsu Oosawa; Satoru Kawakami, both of Sagamihara; Mitsuhiro Yuasa, Tokyo, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/559,750

(22) Filed: Apr. 27, 2000

(30) Foreign Application Priority Data

Apr. 27, 1999 (JP) ............................. 11-118889
Apr. 27, 1999 (JP) ............................. 11-119002

(51) Int. Cl.$^7$ ........................... C23C 16/00; H05H 1/00
(52) U.S. Cl. ........................... 118/728; 118/723 MW; 118/713; 156/345
(58) Field of Search ........................ 118/728, 723 MW, 118/723 ME, 723 MR, 723 MA, 729, 715, 500, 713; 156/345

(56) References Cited

U.S. PATENT DOCUMENTS

| 5,413,688 A | * | 5/1995 | Crowley | 204/298.11 |
| 5,575,883 A | * | 11/1996 | Nishikawa | 156/345 |
| 5,587,205 A | * | 12/1996 | Saito et al. | 427/553 |
| 6,093,281 A | * | 7/2000 | Wise et al. | 156/345 |
| 6,120,609 A | * | 9/2000 | Selyutin et al. | 118/728 |
| 6,178,919 B1 | * | 1/2001 | Li et al. | 118/723 E |

FOREIGN PATENT DOCUMENTS

| JP | 8-264462 A | * | 10/1996 | ......... H01L/21/205 |
| JP | 11-297672 A | * | 10/1999 | ......... H01L/21/205 |

* cited by examiner

Primary Examiner—Gregory Mills
Assistant Examiner—P. Hassanzadeh
(74) Attorney, Agent, or Firm—Pillsbury Winthrop LLP

(57) ABSTRACT

A microwave plasma processing apparatus has a process chamber in which an object to be processed is subjected to plasma processing under a predetermined negative pressure environment. A susceptor holding the object thereon is provided in the process chamber. The susceptor is moved by a susceptor moving member which is moved by a susceptor moving mechanism located outside the process chamber. The susceptor moving member extends from the process chamber via a bellows provided to a bottom of the process chamber. The bellows allows a vertical movement of the susceptor moving member while providing a hermetic seal to the process chamber to maintain the predetermined negative pressure environment in the process chamber. A vacuum pump is provided to the bottom of the process chamber so that an inlet opening of the vacuum pump aligns with the susceptor in the vertical direction.

12 Claims, 9 Drawing Sheets

MICROWAVE PLASMA PROCESSING APPARATUS HAVING A VACUUM PUMP LOCATED UNDER A SUSCEPTOR

BACKGROUND OF THE INVENTION

1. Field of the Invention

The present invention relates to a microwave plasma processing apparatus and, more particularly, to a microwave plasma processing apparatus having a vacuum chamber in which an object to be processed such as a semiconductor wafer is subjected to plasma processing.

2. Description of the Related Art

Recently, in a semiconductor device manufacturing process, plasma processing apparatuses have been used to perform semiconductor producing processes such as a deposition process, an etching process or an ashing or stripping process since high-density integration and fine structure are required for semiconductor devices. Particularly, a microwave plasma processing apparatus has become popular since the microwave plasma processing apparatus is capable of generating stable plasma at a relatively low vacuum of 0.1 millitorr (mTorr) to several tens of mTorr. The microwave plasma processing apparatus generates high-density plasma by using a microwave or a combination of a microwave and a magnetic field generated by a ring-like coil.

In a typical microwave plasma processing apparatus, a 2.45 GHz microwave is introduced into a process chamber via a waveguide and a slot electrode. A reaction gas is also introduced into the process chamber, which is maintained at a predetermined negative pressure. The reaction gas introduced into the process chamber is changed into active radicals and ions by the microwave so as to produce plasma. An object to be processed such as a semiconductor wafer is placed in the process chamber so that a predetermined process such as an etching process is performed on the object by utilizing the action of the plasma.

FIG. 1 is an illustration of a structure of a conventional plasma processing apparatus. The conventional plasma processing apparatus 1 shown in FIG. 1 comprises: a process chamber 2 in which an object W to be processed is placed; a microwave generator 4 which generates a microwave to be introduced into the process chamber 2; and vacuum pumps 6 connected to the process chamber 2 for maintaining the process chamber 2 at a predetermined negative pressure.

The object W to be processed is placed on a susceptor 8 provided in the process chamber 2. The susceptor 8 is supported by a rod 10 which is moved up and down by a vertical moving mechanism 12. The rod 10 extends out of the process chamber 2 with a bellows 14 provided on the bottom of the process chamber 2 so as to hermetically seal the process chamber 12.

It should be noted that FIG. 1 is a schematic illustration for mainly explaining the vertical movement of the susceptor 8 and the positions of the vacuum pumps 6, and other members such as a gate connected to other cluster chambers or a reaction gas supply port are omitted for the sake of simplification of the figure.

The susceptor 8 provided in the process chamber 2 shown in FIG. 1 can be moved up and down by the vertical moving mechanism 12 via the rod 10 so that a processing speed of the object W to be processed can be adjusted by changing a process condition of the object W since the processing speed varies depending on a vertical position of the object W within the process chamber 2. For example, when the plasma processing is managed in accordance with a time period during which the object W is subjected to the plasma processing, the vertical position of the object W to be processed must be adjusted so as to obtain a desired degree of plasma processing within a predetermined time period.

The process chamber 2 has the bellows 14 on the bottom thereof, and the rod 10 extends to the vertical moving mechanism through the bellows 14 so as to maintain a hermetic seal between the rod 10 and the process chamber 2. If the rod 10 horizontally extends within the process chamber 2 and the vertical moving mechanism 12 is provided on the side of the process chamber 2, the hermetic seal of the process chamber 2 cannot be achieved by the bellows 14 since the direction of movement of the rod 10 is perpendicular to the direction of deformation of the bellows 14. Accordingly, in order to move the susceptor 8 up and down and achieve a hermetic seal between the rod 10 and the process chamber 2, it is preferable that the bellows 14 be positioned on the bottom of the process chamber 2 as shown in FIG. 1. In this case, the length of the rod 10 can be short since the vertical moving mechanism 12 is positioned directly underneath the susceptor 8, and a smooth movement of the rod 10 can be achieved.

The vacuum pumps 6 are directly connected to the bottom of the process chamber 2. That is, each of the vacuum pumps 6 is mounted on the process chamber without any connecting pipe therebetween. The structure shown in FIG. 1 can achieve a better vacuum characteristic, as long as maintenance of a high-vacuum condition is concerned, than a structure of the plasma processing apparatus in which a vacuum pump is connected to a process chamber via a connecting pipe.

Two or more vacuum pumps 6 are provided symmetrically around the bottom of the process chamber 2 so as to uniformly evacuate air or gas from the process chamber 2 so that a uniform plasma density can be achieved in the process chamber 2. This is because, if the plasma in the process chamber 2 is locally concentrated, the degree of the plasma processing on the object W will vary according to the said local concentration.

However, the plasma processing apparatus 1 shown in FIG. 1 must be large in its size and complex in its structure since the plurality of vacuum pumps 6 are provided diagonally around the periphery of the bottom of the process chamber 2. Accordingly, a manufacturing cost of the plasma processing apparatus 1 is high.

Additionally, the structure of the plasma processing apparatus 1 in which the plurality of vacuum pumps 6 are provided still has a problem in that the plasma density cannot be completely uniform in the process chamber 2 since the number of vacuum pumps 6 which can be connected to the periphery of the bottom of the process chamber 2 is limited. The inventors found that a uniform plasma density can be achieved by a single vacuum pump being provided in the center of the bottom of the process chamber 2. However, in the structure shown in FIG. 1, the vacuum pump 6 cannot be moved to the center of the bottom of the process chamber 2 since the rod 10 and the vertical moving mechanism 12 are positioned in the center of the bottom of the process chamber 2.

SUMMARY OF THE INVENTION

It is a general object of the present invention to provide an improved and useful microwave plasma processing apparatus in which the above-mentioned problems are eliminated.

A more specific object of the present invention is to provide a microwave plasma processing apparatus having a process chamber in which a susceptor is movable by a vertical moving mechanism having a simple structure while a vacuum pump is positioned in the center of the bottom of the process chamber.

In order to achieve the above-mentioned objects, there is provided according to one aspect of the present invention a microwave plasma processing apparatus, comprising: a process chamber in which an object to be processed is subjected to plasma processing under a predetermined negative pressure environment; a susceptor provided in the process chamber, the susceptor being configured to hold the object thereon; a susceptor moving member connected to the susceptor; a first bellows provided to a bottom of the process chamber, the first bellows being connected to the susceptor moving member so as to allow a vertical movement of the susceptor moving member while providing a hermetic seal to the process chamber to maintain the predetermined negative pressure environment in the process chamber; a susceptor moving mechanism provided outside the process chamber, the susceptor moving mechanism moving the susceptor moving member in the vertical direction so as to move the susceptor in the vertical direction within the process chamber; and a vacuum pump provided to the bottom of the process chamber so that an inlet opening of the vacuum pump substantially aligns with the susceptor in the vertical direction.

According to the above-mentioned invention, the susceptor moving member is movable in the vertical direction in the process chamber while the first bellows maintains the process chamber hermetically sealed. Additionally, since the vacuum pump is provided to the bottom of the process chamber and is aligned with the susceptor in the vertical direction. Thereby, uniform evacuation can be achieved in the process chamber by positioning the susceptor and the vacuum pump substantially in the center of the process chamber. Thus, there is no need to provide a plurality of vacuum pumps around the periphery of the bottom of the process chamber, resulting in reduced size and cost of the microwave plasma processing apparatus.

Additionally, there is provided according to another aspect of the present invention a microwave plasma processing apparatus comprising: a process chamber in which an object to be processed is subjected to plasma processing under a predetermined negative pressure environment; a susceptor provided in the process chamber, the susceptor being configured to hold the object thereon; an object moving member configured to move the object relative to the susceptor in the vertical direction; a bellows provided to the bottom of the process chamber, the bellows being connected to the object moving member so as to allow a vertical movement of the object moving member while providing a hermetic seal between the object moving member and the process chamber to maintain the predetermined negative pressure environment in the process chamber; an object moving mechanism provided outside the process chamber, the object moving mechanism moving the object moving member in the vertical direction so as to move the object in the vertical direction within the process chamber; and a vacuum pump provided to the bottom of the process chamber so that an inlet opening of the vacuum pump substantially aligns with the susceptor in the vertical direction.

According to this invention, the object moving member is movable in the vertical direction in the process chamber while the bellows maintains the process chamber hermetically sealed. Additionally, the vacuum pump is provided to the bottom of the process chamber and is aligned with the susceptor in the vertical direction. Thereby, uniform evacuation can be achieved in the process chamber by positioning the susceptor and the vacuum pump substantially in the center of the process chamber. Thus, there is no need to provide a plurality of vacuum pumps around the periphery of the bottom of the process chamber, resulting in reduced size and cost of the microwave plasma processing apparatus.

Additionally, there is provided according to another aspect of the present invention a cluster tool comprising: a plasma processing apparatus having a process chamber in which an object to be processed is subjected to plasma processing at a predetermined temperature higher than a room temperature; a preheating section in which the object is preheated, the preheating section being provided outside the process chamber; and a conveyor conveying the object between the preheating section and the process chamber.

According to this invention, the object to be processed is preheated in the preheating section before the object to be processed is placed in the process chamber. Accordingly, the temperature of the object can be quickly raised to the predetermined temperature after the object is placed in the process chamber, resulting in a reduced time period for heating the object in the process chamber. Thus, the plasma processing can be quickly started after the object is placed in the process chamber.

Additionally, there is provided according to another aspect of the present invention a cluster tool comprising: a plasma processing apparatus having a process chamber in which an object to be processed is subjected to plasma processing at a predetermined temperature higher than a room temperature; a cooling section in which the object is cooled, the cooling section being provided outside the process chamber; and a conveyor conveying the object between the cooling section and the process chamber.

According to this invention, the object to be processed is cooled in the cooling section after the object is processed in the process chamber. Accordingly, the temperature of the object can be quickly decreased after the object is taken out of the process chamber, resulting in a reduced time period for preparing the object for a subsequent process. Thus, the subsequent process can be quickly started after the object is taken out of the process chamber.

Additionally, there is provided according to another aspect of the present invention a plasma processing method performed by a cluster tool, comprising the steps of: conveying an object to be processed to a preheating section outside a process chamber; preheating the object in the preheating section; conveying the preheated object to the process chamber; applying a plasma process to the object in the process chamber; conveying the processed object to a cooling section outside the process chamber; and cooling the processed object in the cooling section.

According to this invention, the object to be processed is preheated in the preheating section before the object to be processed is placed in the process chamber. Accordingly, the temperature of the object can be quickly raised to the predetermined temperature after the object is placed in the process chamber, resulting in a reduced time period for heating the object in the process chamber. Thus, the plasma processing can be quickly started after the object is placed in the process chamber. Additionally, the object is cooled in the cooling section after the object is processed in the process chamber. Accordingly, the temperature of the object can be quickly decreased after the object is taken out of the process chamber, resulting in a reduced time period for preparing the object for a subsequent process. Thus, the subsequent process can be quickly started after the object is taken out of the process chamber.

Other objects, features and advantages of the present invention will become more apparent from the following detailed descriptions when read in conjunction with the accompanying drawings.

DETAILED DESCRIPTION OF THE PREFERRED EMBODIMENTS

Figure 2:
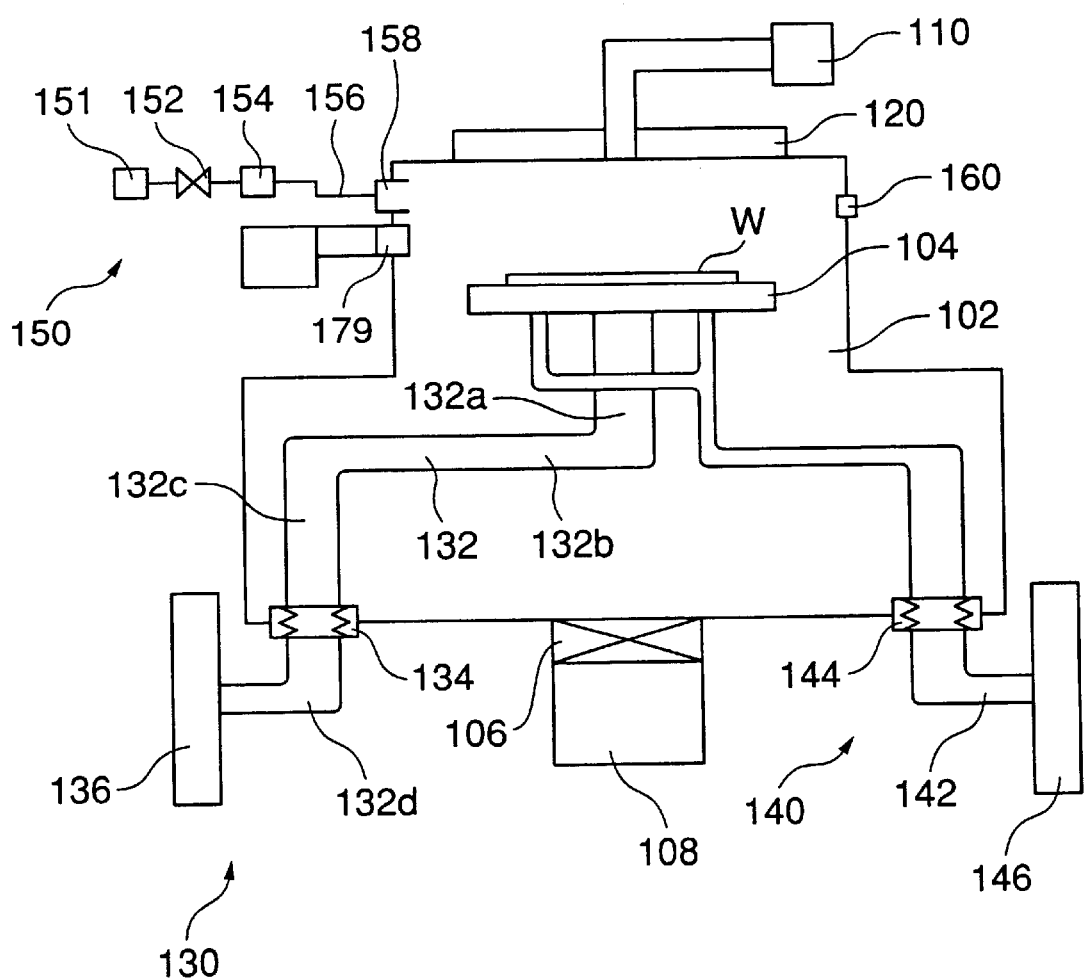
FIG. 2 is an illustration of an entire structure of a microwave plasma processing apparatus according to a first embodiment of the present invention.

A description will now be given of a microwave plasma processing apparatus according to a first embodiment of the present invention. FIG. 2 is an illustration of an entire structure of the microwave plasma processing apparatus 100 according to the first embodiment of the present invention. The microwave plasma processing apparatus 100 according to the present embodiment serves as a chemical vapor deposition (CVD) apparatus.

The microwave plasma processing apparatus 100 according to the present invention comprises: a process chamber 102 provided with a susceptor 104 on which an object W to be processed is placed; a vacuum pump 108 connected to the process chamber 102; a susceptor moving system 130 for moving the susceptor 104 up and down in the process chamber 102; a lifter pin moving system 140 in the process chamber 102; a reaction gas supply system 150 for introducing a reaction gas into the process chamber 102; a view port 160 provided to the process chamber 102; and a microwave generator 110 for generating a microwave to be introduced into the process chamber 102. It should be noted that a control system for controlling operations of the microwave plasma processing apparatus 100 is not shown in the figure.

The process chamber 102 has a side wall and a bottom wall which are made of a conductive material such as aluminum. The process chamber 102 has a hollow shape having a bottom part larger than a top opening. The process chamber 2 can be maintained at a negative pressure or vacuum by a vacuum pump 108. In this embodiment, the vacuum pump 108 is a high vacuum pump which can generate a high vacuum. The susceptor 104 is provided in the process chamber 102 so that the object W to be processed can be placed thereon. It should be noted that an electrostatic chuck and a clamp mechanism for fixing the object W to the susceptor 104 are not show in FIG.2 for the sake of simplification of the figure.

The susceptor 104 controls a temperature of the object W to be processed in the process chamber 102. For example, the object W is maintained at a temperature of about 450° C. for the CVD process. If an etching process is performed by the microwave plasma processing apparatus 100, the object W is maintained at a temperature lower than 80° C. In either case, the object W to be processed is maintained at a temperature at which a water component, an impurity, does not adhere to the object W. A method of controlling the temperature can be achieved by any methods known in the art such as a combination of a temperature sensor and a heater as described later.

Figure 3:
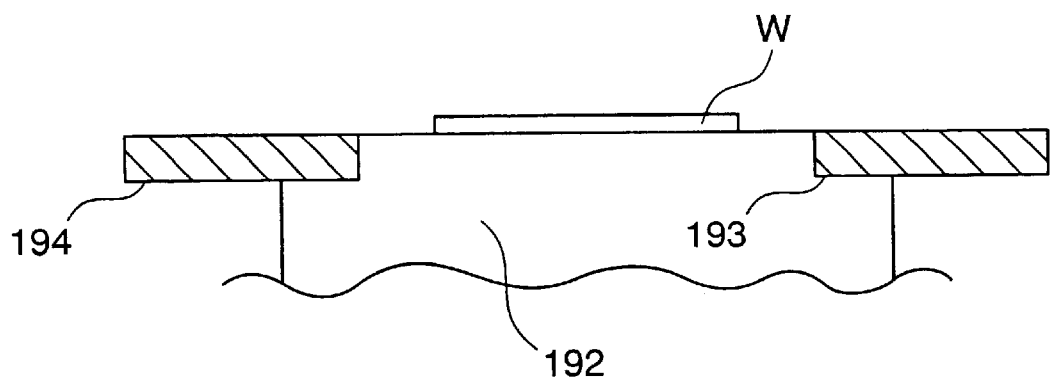
FIG. 3 is a cross-sectional view of a susceptor having a baffle plate.
Figure 4:
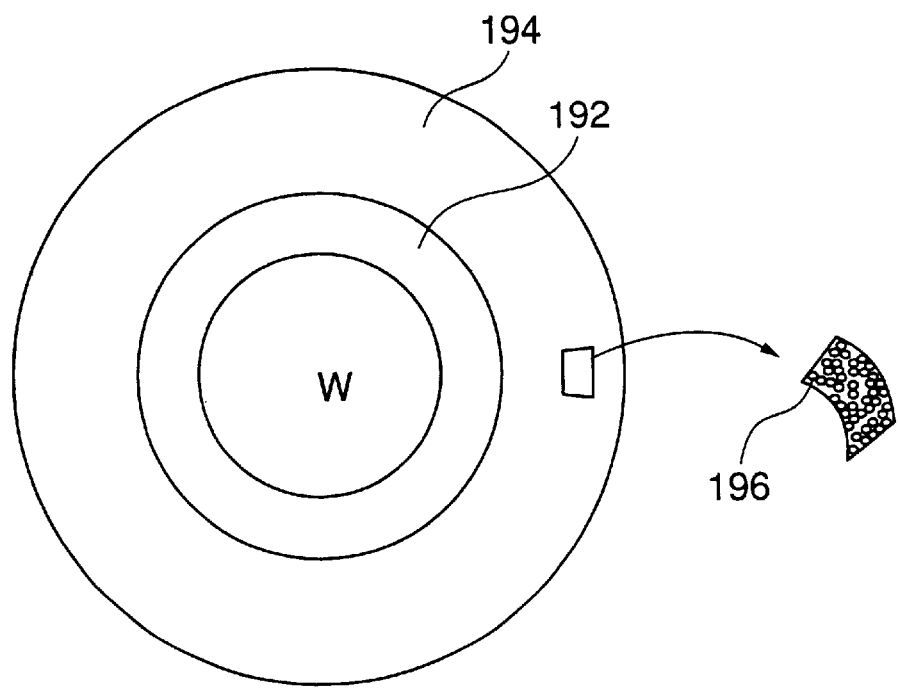
FIG. 4 is a plan view of the susceptor shown in FIG. 3 on which the object to be processed is placed.

The susceptor 104 may be replaced with a susceptor 192 shown in FIGS. 3 and 4. FIG. 3 is a cross-sectional view of the susceptor 192 having a baffle plate 194, and FIG. 4 is a plan view of the susceptor 192 on which the object W to be processed is placed.

As shown in FIG. 3, the susceptor 192 has a step part 193 on the periphery thereof, and the baffle plate 194 fits to the step part 103 of the susceptor 192. In this case, the susceptor 192 moves up and down together with the baffle plate 194. Alternatively, the baffle plate 194 may be configured to be brought into engagement with the susceptor 192 when the susceptor 192 is moved to a process position as described later. The baffle plate 194 separates a process space in which the object W is present from an exhaust space underneath the process space so as to maintain the process space at a predetermined potential to attract the microwave to the process space and to maintain the process space at a predetermined vacuum, for example, 50 mTorr.

The baffle plate 194 is made of pure aluminum, and has a disk-like shape having a center hole. The thickness of the baffle plate 194 is about 2 mm. The baffle plate 194 has a lot of small holes 196 arranged at random as shown in FIG.4 so that an opening ratio is more than 50%. Alternatively, the baffle plate 194 may have a meshed structure. If possible, the baffle plate 194 may have a function to prevent a reverse flow from the exhaust space to the process space or a function to create a pressure difference between the exhaust space and the process space.

The side wall of the process chamber 102 is provided with a gas supply nozzle 158 of the reaction gas supply system 150. The gas supply nozzle 158 is made of a quartz pipe, and is connected to a reaction gas source 151 by a gas supply line via a mass flow controller 154 and a stop valve 152. For example, in order to deposit a silicon nitride film, $NH_3$ or $SiH_4$ is mixed with a mixture gas of $N_2$, $H_2$ and one of neon, xenon, argon, helium, radon and krypton. It should be noted that a variation of the reaction gas supply system 150 will be described later.

In the present embodiment, the vacuum pump 108 is a turbo molecular pump (TMP), and is connected to the process chamber 102 via a pressure adjust valve 106. The pressure adjust valve 106 is a valve which is known in the art as a conductance valve, a gate valve or a high-vacuum valve. The pressure adjust valve 106 is closed when it is not used, and is opened so as to maintain the process chamber 102 by the vacuum pump 108 at a predetermined negative pressure in the range of 0.1 mTorr to 10 mTorr.

In the present embodiment, in order to achieve a uniform exhaust or evacuation, the maximum opening area S1 of the pressure adjust valve 106 and the minimum horizontal cross-sectional area S of the process chamber 102 satisfy a relationship S1<S. The minimum horizontal cross-sectional area S is a horizontal cross-sectional area of the process chamber 102 in which the cross-sectional area of component parts such as a vertical moving member 132 provided in the process chamber 102 is excluded.

It should be noted that, as shown in FIG.2, according to the present embodiment, the vacuum pump 108 is directly connected to the process chamber 102. That is, the vacuum pump 108 is connected to the process chamber 102 without any connecting pipe therebetween although the pressure adjust valve 106 is provided between the vacuum pump 108 and the process chamber 102.

Figure 1:
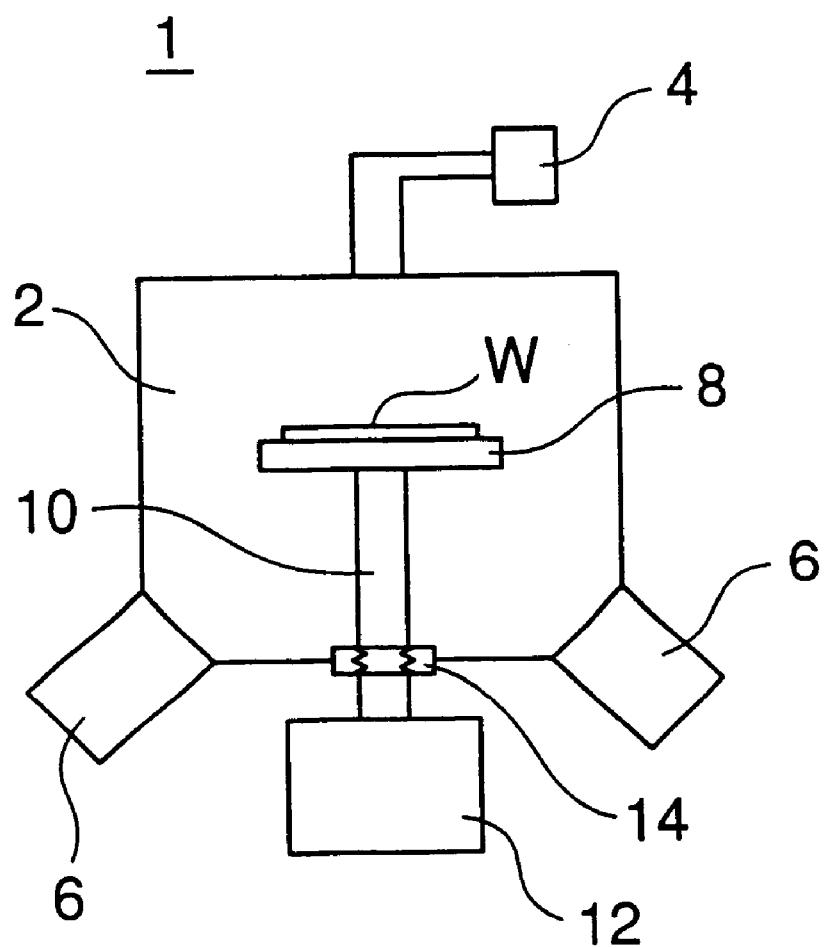
FIG. 1 is an illustration of a structure of a conventional plasma processing apparatus.

Since the vacuum pump 108 is connected to the bottom of the process chamber 102 underneath the susceptor 104, the vacuum pump 108 can uniformly evacuate air or gas from the entire process chamber 102. Accordingly, a uniform plasma density can be maintained in the process chamber 102, and, therefore, the degree of plasma processing of the object W to be processed is prevented from varying due to a local concentration of the plasma density. Additionally, there is no need to provide a plurality of vacuum pumps as in the plasma processing apparatus 1 shown in FIG. 1. The plasma processing apparatus 100 according to the present embodiment can be reduced in its size and cost.

In the present embodiment, the microwave generator 110 comprises a magnetron, which can generate, for example, a 2.45-GHz, 5-kW microwave. The microwave generated by the microwave generator 110 is converted into a TM mode, a TE mode or a TEM mode by a mode converter (not shown in the figure). It should be noted that, in FIG.2, an isolator for absorbing a microwave returning to the microwave generator 110 and a stub tuner for load matching are not shown for the sake of simplification of the figure.

Figure 5:
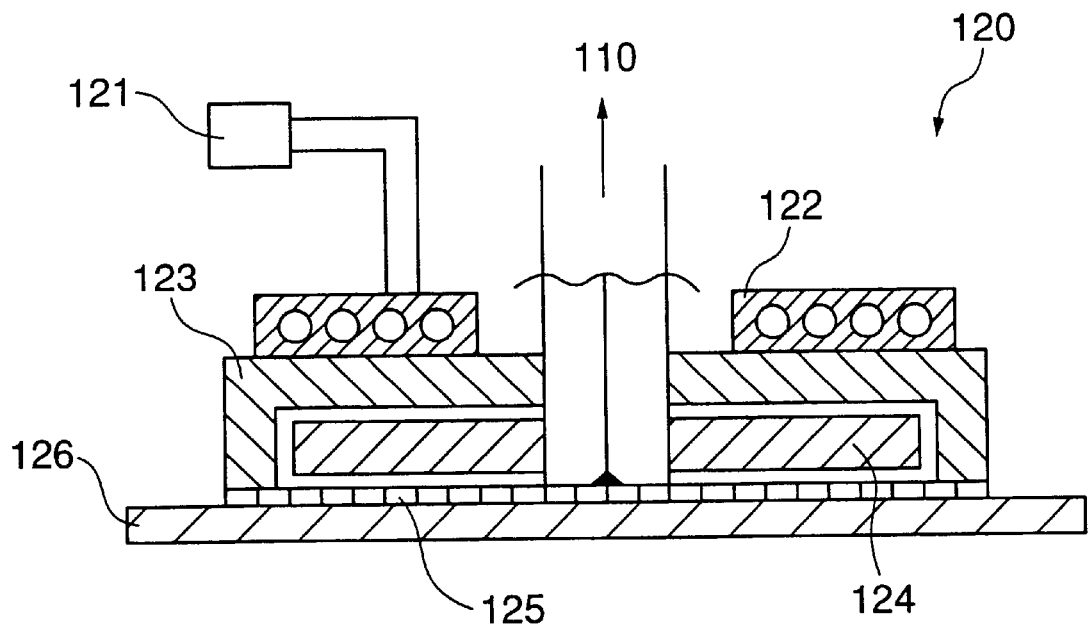
FIG. 5 is a cross-sectional view of an upper part of the microwave plasma processing apparatus shown in FIG.2.

The antenna member 120 comprises, as shown in FIG. 5, a temperature control plate 122, an antenna accommodating member 123 and a dielectric plate 126. The temperature control plate 122 is connected to a temperature control unit 121. The antenna accommodating member 123 accommodates a wavelength reducing member 124 and a slot electrode 125 which contacts the wavelength reducing member 124. The dielectric plate 126 is positioned under the slot electrode 125. The antenna accommodating member 123 is made of a material having a high heat conductivity such as stainless steel. A temperature of the antenna accommodating member 123 can be controlled nearly equal to the temperature of the temperature control plate 122.

Figure 6:
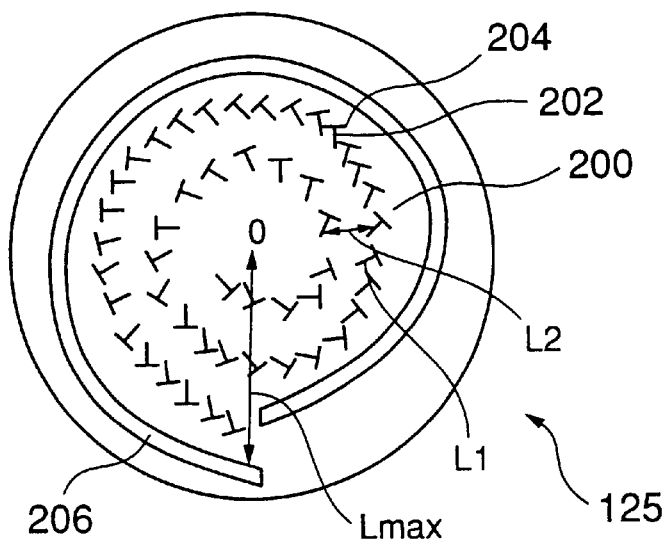
FIG. 6 is a plan view of a slot electrode.

The wavelength reducing member 124 is made of a material having a predetermined permittivity to reduce the wavelength of the microwave transmitted therethrough. The material of the wavelength reducing member 124 also has a high heat conductivity. As shown in FIG. 6, many slits 200 must be formed in the slot electrode 125 so as to achieve uniform plasma density in the process chamber 102. The wavelength reducing member 124 has a function to allow many slits 200 to be formed in the slot electrode 125.

Ceramics such as SiN or AlN can be used for the wavelength reducing member 124. For example, the specific permittivity $\epsilon_r$ of AlN is about 9 and, thus, the wavelength reducing rate n is 0.33 ($n=1/(\epsilon_r)^{1/2}=0.33$). Accordingly, the transmission rate of the microwave after passing through the wavelength reducing member 124 becomes 0.33 times the original transmission rate, and, thus, the wavelength also becomes 0.33 times the original wavelength. Accordingly, a distance between adjacent slits 200 can be reduced, resulting in a larger number of slits 200 being provided in the slot electrode 125.

The slot electrode 125 is formed of a copper plate having a circular shape whose diameter is, for example, about 50 cm and thickness is less than 1 mm. The slot electrode 125 is fixed to the wavelength reducing member 124 by screws. As shown in FIG. 6, the slot electrode 125 has many T-slits 200 that are arranged along a spiral which starts near the center O of the slot electrode 125 and extends toward the periphery in about two turns.

In the present embodiment, each T-slit 200 comprises a pair of slits 202 and 204 forming a T shape with a predetermined distance therebetween. More specifically, each of the slits 202 and 204 has a length L1 which is in the range of about one half of the wavelength $\lambda_0$ of the microwave to 2.5 times a free space wavelength. The width of each of the slits 202 and 204 is about 1 mm. A distance L2 between two adjacent pairs of slits along a radial direction is approximately equal to the wavelength $\lambda_0$. That is, the length L1 of each of the slits 202 and 204 is set to satisfy the following relationship.

$$(\lambda_0/2 \times 1/\sqrt{\epsilon_r}) \leq L1 \leq (\lambda_0 \times 2.5)$$

By setting each of the slits 202 and 204 to the above-mentioned structure, a uniformly distributed microwave can be achieved in the process chamber 102.

A radiation element 206 having a width of about 1 mm is provided outside the spirally arranged T-slits 200 so as to prevent reflection of the microwave transmitted toward the periphery of the slot electrode 125. The radiation element 206 is provided for increasing an antenna efficiency of the slot electrode 125. It should be noted that the configuration of the pair of slits 202 and 204 is not limited to the above-mentioned T shape, and, for example, L-shaped slits may be used for the slot electrode 125.

The temperature control plate 122 serves to control the temperature change of the antenna accommodating member 123 and component parts near the antenna accommodating member 123 to fall within a predetermined range. A temperature sensor and a heater unit (both not shown in the figure) are connected to the temperature control plate 122. The temperature control unit 121 controls a temperature of the temperature control plate 122 to be a predetermined temperature by introducing a cooling water or a coolant such as alcohol, gulden or flon into the temperature control plate 122. The temperature control plate 122 is made of a material such as stainless steel, which has a high heat conductivity and can be machined to form a fluid passage for the coolant therein.

The temperature control plate 122 contacts the antenna accommodating member 123, and each of the antenna accommodating member 123 and the wavelength reducing member 124 has a high heat conductivity. Accordingly, the temperature of each of the wavelength reducing member 124 and the slot electrode 125 can be controlled by merely controlling the temperature of the temperature control plate 122.

The temperature of each of the wavelength reducing member 124 and the slot electrode 125 is increased due to energy absorption when the microwave of the microwave generator 110 is supplied thereto for a long period of time. As a result, each of the wavelength reducing member 124 and the slot electrode 125 may deform due to thermal expansion.

For example, if the slot electrode 125 thermally deforms, the length of each slit is changed, which results in a decrease in the plasma density or localization of the plasma in the process chamber 102. The decrease in the plasma density may slow down a plasma processing speed such as an etching rate or a film deposition rate. As a result, if the plasma processing is controlled based on a processing time, there may be a case in which a desired result of the plasma processing (such as plasma etching depth or plasma deposition thickness) cannot be obtained when the plasma processing is applied for a predetermined time period (for example, two minutes), that is, for example, if the object W is processed for a predetermined time (for example, two minutes) and thereafter removed from the process chamber 102. Additionally, if the plasma density in the process chamber 102 is localized, the magnitude of plasma processing applied to the semiconductor wafer may vary. As mentioned above, if a deformation occurs in the slot electrode 125, the quality of plasma processing may deteriorate.

Further, if the temperature control plate 122 is not provided, the slot electrode 125 may warp since the wavelength reducing member 124 and the slot electrode 125 are different from each other and the both members are fixed to each other by screws. In such a case, the quality of plasma processing may deteriorate for a reason similar to the above-mentioned reason.

A dielectric material member 126 is provided between the slot electrode 125 and the process chamber 102 so as to close the top opening of the process chamber 102. The slot electrode 125 is tightly joined to the surface of the dielectric material member 126 by brazing. Alternatively, the slot electrode 125 can be formed by a copper plate applied to the surface of the dielectric material member 126.

It should be noted that the function of the temperature control plate 122 may be provided to the dielectric material member 126. That is, the temperature of the dielectric material member 126 can be controlled by integrally forming a temperature control plate with the dielectric material member 126, which temperature control plate has a coolant passage near the side of the dielectric material member 126. By controlling the temperature of the dielectric material member 126, the temperature of the wavelength reducing member 124 and the slot electrode 125 can be controlled. The dielectric material member 126 is mounted to the process chamber 102 with an O-ring provided therebetween. Accordingly, the temperature of the dielectric material member 126 can be controlled by controlling a temperature of the O-ring, and, thereby controlling the temperature of the wavelength reducing member 124 and the slot electrode 125.

The dielectric material member 126 is made of a dielectric material such as aluminum nitride (AlN). The dielectric material member 126 prevents the slot electrode 125 from being deformed due to a negative pressure generated in the process chamber 102. Additionally, the dielectric material member 126 prevents the slot electrode 125 from being exposed to the atmosphere inside the process chamber 102 so that the environment inside the process chamber 102 is prevented from being contaminated by copper. If necessary, the dielectric material member 126 may be formed of a dielectric material having a low heat conductivity so as to prevent the slot electrode 125 from being influenced by heat from the process chamber 102.

A description will now be given of the susceptor moving system 130. As shown in FIG. 2, the susceptor moving system 130 comprises a vertical moving member 132, a bellows 134 and a vertical moving unit 136 provided outside the process chamber 102.

The vertical moving member 132 is formed as a single member made of aluminum. Alternatively, the vertical moving member 132 may have a mechanical structure such as a hinge mechanism. In such a case, care must be taken to prevent the process chamber 102 from being contaminated by a lubricant if the mechanical structure requires lubrication.

The vertical moving member 132 is provided for moving the susceptor 104 by being driven by the vertical moving unit 136. One end of the vertical moving member 132 is connected to the susceptor 104, and the other end is connected to the vertical moving unit 136. The vertical moving member 132 comprises a first vertical part 132a, a first horizontal part 132b, a second vertical part 132c and a second horizontal part 132d.

The second horizontal part 132d is connected to the vertical moving unit 136, and the second horizontal part 132d is vertically moved along the side of the process chamber 102. Since the bottom of the process chamber 102 is expanded and the vacuum pump 108 is located in the center of the bottom of the process chamber 102, there is a space to provide the vertical moving unit 136 under the bottom of the process chamber 102. Thus, the vertical moving unit 136 may be located under the bottom of the process chamber. Alternatively, a third vertical part may be provided at the end of the second horizontal part 132d, and the vertical moving unit 136 may be connected to the third vertical part.

In the present embodiment, the vacuum pump 108 is located in the center of the bottom of the process chamber 102 instead of locating the vertical moving unit 136 in the center of the bottom of the process chamber 102. This is because the vacuum pump 108 being located in the center of the bottom of the process chamber 102 allows a uniform evacuation of air or gas from the process chamber 102. This structure can be achieved by locating the bellows 134 on the periphery of the bottom of the process chamber 102 and providing the vertical moving member 132 having the first horizontal part 132b extending in the horizontal direction from the center to the periphery of the process chamber 102. Additionally, the direction of deformation of the bellows 134 is the same as the direction of movement of the second vertical part 132c of the vertical moving member 132. Thus, the bellows 134 can provide an effective seal between the vertical moving member 132 and the bottom of the process chamber 102. It should be noted that as a variation of the present embodiment, the first horizontal part 132b of the vertical moving member 132 may be connected to a side of the susceptor 104.

The vertical moving unit 136 moves the vertical moving member 132 while controlling a travel distance of the vertical moving member 132 by using a known technique such as a mechanical means, an electric means, a magnetic means or an optical means or a combination of the foregoing. A sensor including an optical sensor such as a photo-diode can be preferably used to detect a travel distance of the vertical moving member 132.

The susceptor 104 moves up and down between a home position and a process position. The susceptor 104 is moved to the home position when the plasma processing apparatus 100 is turned off or in a waiting mode. At the home position, the susceptor 104 receives the object W to be processed from a conveyor arm of a cluster tool 170 described later. The object W is inserted into the process chamber 102 through a gate valve 179 provided on the side wall of the process chamber 102. A receiving position may be set at which the object W to be processed is placed on the susceptor 104. A travel distance of the susceptor 104 can be controlled by a control unit of the vertical moving unit 136 or a control unit of the microwave plasma processing apparatus 100. A position of the susceptor 104 can be observed through the view port 160.

A description will now be given of a lifter pin moving system 140. Similar to the susceptor moving system 130, the lifter pin moving system 140 comprises a vertical moving member 142, a bellows 144 and a vertical moving unit 146. One end of the vertical moving member 142 is connected to three lifter pins (not shown in the figure) located at vertices of an equilateral triangle, respectively. The lifter pins penetrate through the susceptor 104 from the bottom side to the top side so as to lift the object W from the top surface of the susceptor 104. The lifter pins are moved when the object W is inserted into the process chamber 102 and when the object W is transferred to the conveyor arm of the cluster tool 170.

In the present embodiment, the bellows 144 for sealing the vertical moving member 142 is also provided to the bottom of the process chamber 102. The direction of deformation of the bellows 142 is the same as the direction of movement of the vertical moving member 142. Thus, the bellows 144 can provide an effective seal between the vertical moving member 142 and the bottom of the process chamber 102.

The vertical moving unit 146 may be configured so as to allow the lifter pins to move only when the susceptor 104 is at a predetermined position such as a home position. The travel distance of the lifter pins can be controlled by a control unit of the vertical moving unit 146 or a control unit of the microwave plasma processing apparatus 100. Additionally, the movement of the lifer pins can be observed through the view port 160.

The reaction gas supply system 150 has a structure in which a nozzle 158 is provided to the side wall of the process chamber 102 so as to supply a reaction gas (process gas) to the process chamber 102. Accordingly, the flow of the reaction gas may traverse in a space above the object W. Even if a plurality of nozzles 158 are provided symmetrically with respect to the center of the susceptor 104, the density of the reaction gas cannot be uniform. Thus, a uniform plasma density cannot be achieved. In order to solve this problem, it can be considered to provide a shower head in a position above the susceptor 104. Such a shower head can be made of a glass tubing so that an electric field generated in the process chamber 102 is not disturbed by the shower head. However, such a shower head is not practical since a plasma may be undesirably generated within the shower head. In order to prevent a plasma from being generated within the shower head, the present inventors conceived a new shower plate 220.

Figure 7:
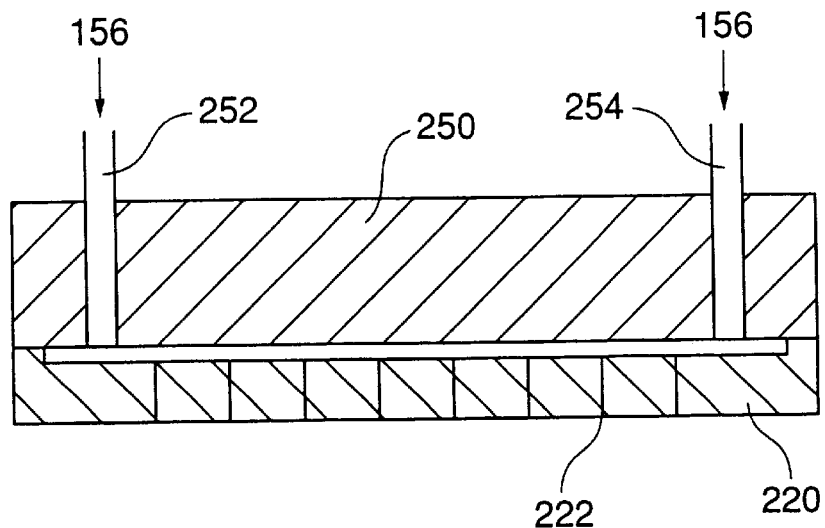
FIG. 7 is an enlarged cross-sectional view of a shower plate.
Figure 8:
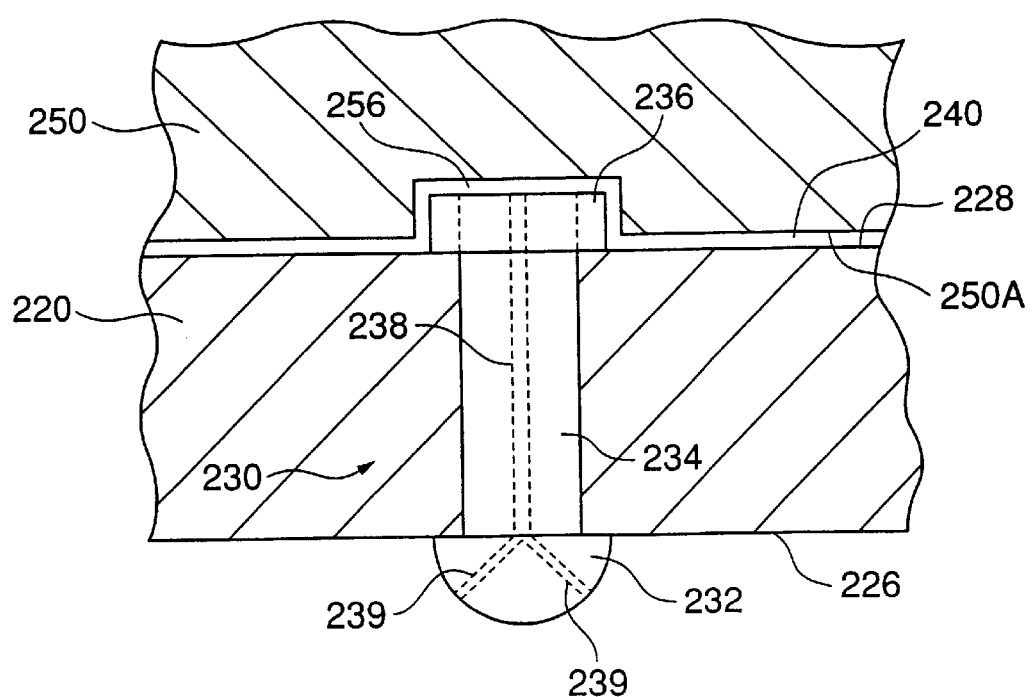
FIG. 8 is an enlarged cross-sectional view of a nozzle part of the shower plate.

A description will now be given, with reference to FIGS. 7 and 8, of the shower plate 220 provided in the microwave plasma processing apparatus 100 according the present embodiment. FIG. 7 is an enlarged cross-sectional view of the shower plate 220. FIG. 8 is an enlarged cross-sectional view of a nozzle part of the shower plate 220.

The shower plate 220 is mounted to a dielectric material plate 250, which corresponds to the dielectric material plate 126 shown in FIG. 5. The dielectric material plate 250 is made of an aluminum nitride (AlN) plate having a thickness of about 30 mm. The dielectric material plate 250 has gas inlet ports 252 and 254 connected to the gas supply line 156. In this case, the nozzle 158 shown in FIG. 2 is removed, and the gas supply line 156 is connected to each of the gas inlet ports 252 and 254. The reaction gas introduced into the gas inlet ports 252 and 254 is lead to a plurality of nozzles 222 formed in the shower plate 220.

The shower plate 220 is made of an aluminum nitride (AlN) plate having a thickness of about 6 mm. The shower plate 220 has a plurality of nozzles 222. As shown in FIG. 8, each of the nozzles 222 is constituted by a nut 236 and a screw comprising a screw head 232 and a screw part 234.

The screw head 232 has a height of about 2 mm. A pair of ejecting passages 239 are formed in the screw head 232. Each of the ejecting passages 239 extends from the center of the screw head 232 in a direction inclined 45 degrees with respect to the bottom surface 226 of the shower plate 220. An end of each of the ejecting passages 239 is connected to a passage 238 formed in the screw part 234. Each of the ejecting passages 239 has a diameter of about 0.1 mm. The ejecting passages 239 are inclined so as to achieve a uniform introduction of the reaction gas. Accordingly, the number of the ejecting passages 239 and their angle with respect to the shower plate 220 may be changed so as to achieve uniform distribution of the reaction gas. It should be noted that, according to experiments conducted by the inventors, uniform distribution of the reaction gas was not achieved by a single ejecting passage extending in a direction perpendicular to the surface 226 of the shower plate 220. It was found that the ejecting passage is preferably inclined as shown in FIG. 8 to achieve uniform distribution of the reaction gas.

The passage 238 formed in the screw part 234 has a diameter of about 1 mm, and extends in a longitudinal direction of the screw part 234. An end of the passage 238 is open to a gap space 240 formed between the dielectric material plate 250 and the shower plate 220. The screw part 234 is inserted into a through hole formed in the shower plate 220, and the screw is fastened to the shower plate 220 by the nut 236 being engaged with the end of the screw part 234. The nut 236 is accommodated in a depression 256 formed on the surface of the dielectric material plate facing the shower plate 220.

The gap space 240 is provided for preventing generation of plasma. The thickness of the gap space 240 required for preventing generation of plasma varies according to a pressure of the reaction gas. That is, for example, the thickness of the gap space 240 is set to about 0.5 mm when the pressure is 10 Torr. In this case, the process space under the shower plate 220 in the process chamber 102 is set to a pressure of about 50 mTorr. The reaction gas is introduced into the process chamber 102 at a predetermined speed by controlling the pressure difference between the reaction gas and the atmosphere in the process chamber 102.

According to the shower plate 220 provided in the present embodiment, the reaction gas can be uniformly introduced and distributed in the process space in the process chamber 102 without generation of plasma before reaching the process space. An amount of flow of the reaction gas can be controlled according to the pressure difference between the gap space 240 and the process space in the process chamber 102, the number of ejecting passages 239, the inclination angle of the ejecting passages 239 and the size of each of the ejecting passages 239.

Figure 9:
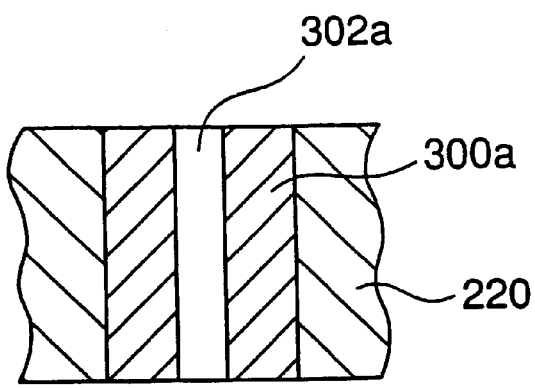
FIG. 9 is a cross-sectional view of a first example of a nozzle member.
Figure 10:
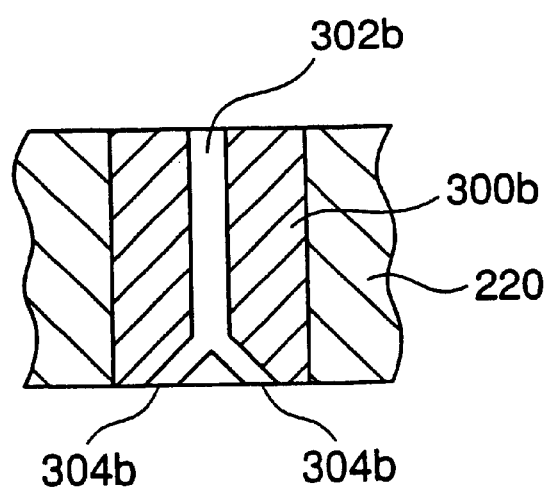
FIG. 10 is a cross-sectional view of a second example of the nozzle member.
Figure 11:
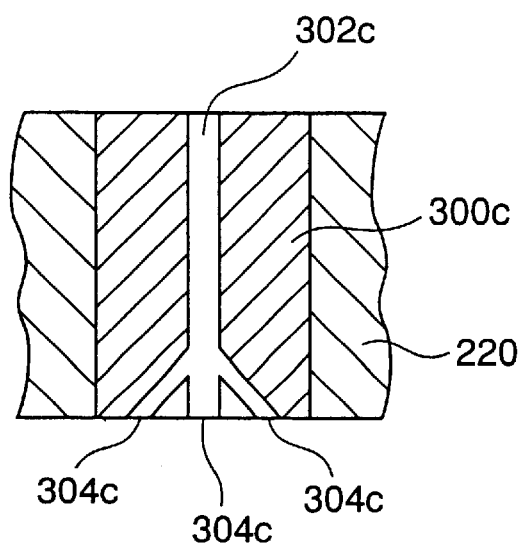
FIG. 11 is a cross-sectional view of a third example of the nozzle member.

The passage 238 and/or the ejecting passages 239 can be provided by nozzle members being inserted into through holes formed in the shower plate 220, respectively. FIGS. 9, 10 and 11 are cross-sectional views of examples of the nozzle member replaceable with the screw and nut arrangement shown in FIG. 8. FIG. 9 shows a nozzle member 300a that is a first example of the nozzle member that can replace the screw and nut arrangement shown in FIG. 8. The nozzle member 300a has a single straight passage 302a in a longitudinal direction of the nozzle member 300a. FIG. 10 shows a nozzle member 300b that is a second example of the nozzle member that can replace the screw and nut arrangement shown in FIG. 8. The nozzle member 300b has a single straight passage 302b connected to a pair of branch passages 304b at one end thereof. FIG. 11 shows a nozzle member 300c that is a third example of the nozzle member that can replace the screw and nut arrangement shown in FIG. 8. The nozzle member 300c has a single straight passage 302c connected to three branch passages 304c at on end of thereof.

Figure 12:
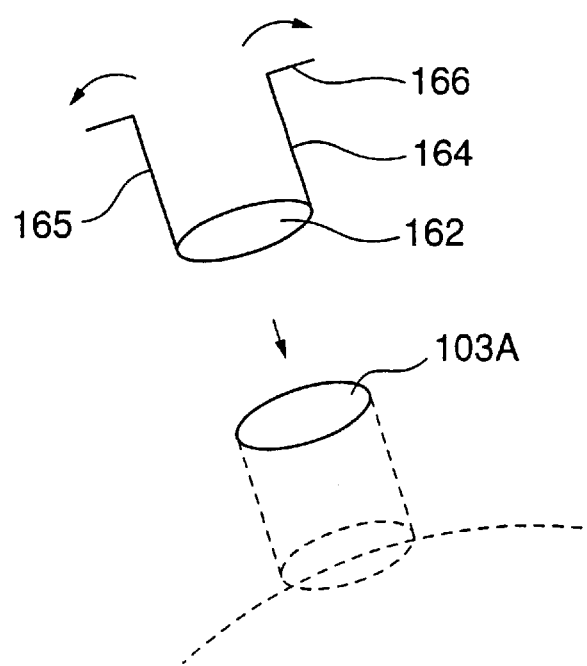
FIG. 12 is an illustration for explaining a mounting structure of a view port.

A description will now be given, with reference to FIG. 12, of the view port 160 for observing the interior of the process chamber 102. FIG. 12 is an illustration for explaining a structure and a mounting structure of the view port 160. The view port 160 is mounted to a side wall of the process chamber 102. The view port 160 is made of glass so that the object W placed on the susceptor 104 can be observed from outside the process chamber 102.

Conventionally, the view port is mounted to the side wall of the process chamber 102 by securing a punching metal from the inner side of the process chamber 102 by means of screws. The punching metal refers to a metal plate having a plurality of through holes formed by punching. The punching metal contacts the inner surface of the process chamber 102 so as to maintain a uniform potential in the process chamber 102. However, it is inconvenient to secure the punching mental to the inner surface of the process chamber 102.

Accordingly, in the present embodiment, the view port 160 is fit in an opening 103A provided in the wall of the process chamber. The view port 160 comprises a punching metal 162 and a pair of mounting parts 164. Each of the mounting parts 164 is made of metal, and includes a vertical part 165 and an engaging parts 166 extending from an end of the vertical part 165. The engaging part 166 is elastically urged in directions indicated by arrows in FIG. 12. That is, the vertical parts 165 are urged so as to be away from each other. In order to mount the view port 160 to the process chamber 102, the punching metal 162 is inserted into the opening 103A while pressing the mounting parts 164 in directions opposite to the direction of urging. The punching metal 162 is fixed inside the opening 103A by an elastic urging force of the mounting parts 164, and the mounting parts contact the inner wall of the opening 103A so as to provide an electromagnetic shielding effect It should be noted that although the view port 160 is sealed with respect to the process chamber 102, the structure of the seal is not shown in FIG. 12. The glass late is also not shown in the figure. The mounting parts 164 are not always required to provide the elastic urging force by themselves. That is, an elastically urging means may be provided separately from the mounting parts 164. Additionally, the engaging parts 166 are not always required.

As mentioned above, the view port 160 shown in FIG. 12 does not require the punching metal plate 162 to be fixed to the inner surface of the process chamber 102 by means of screws. This achieves an easy mounting operation of the view port 160.

Figure 13:
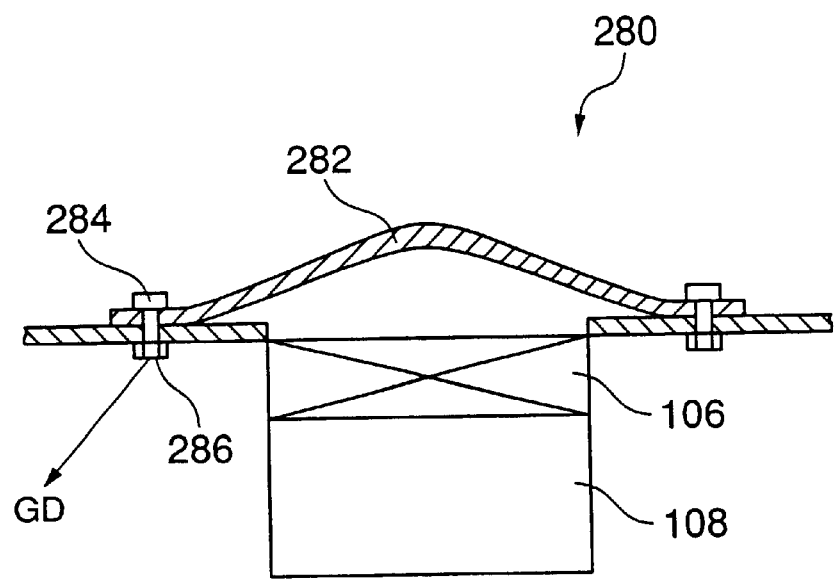
FIG. 13 is a cross-sectional view of a microwave blocking member.
Figure 14:
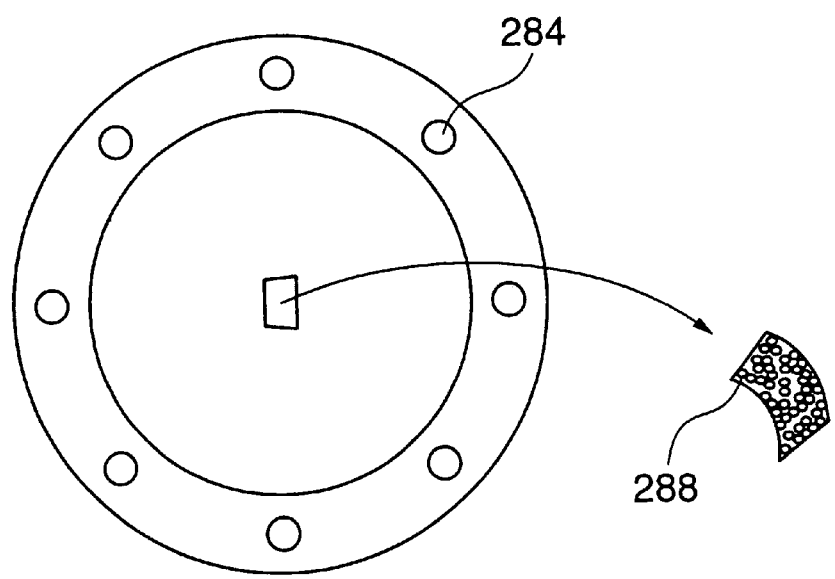
FIG. 14 is a plan view of the microwave blocking member shown in FIG. 12.

A description will now be given, with reference to FIGS. 13 and 14, of a microwave blocking member provided above the pressure adjust valve 106 located in the center of the bottom of the process chamber 102. FIG. 13 is a cross-sectional view of the microwave blocking member 280. FIG. 14 is a plan view of the microwave blocking member 280.

The microwave blocking member 280 comprises a base plate 282 that is fixed to the bottom of the process chamber 102 so as to cover the pressure adjust valve 106 located above the vacuum pump 108. The base plate 282 is fixed to the inner side of the process chamber 102 by a bolt 284 and nut 286 arrangement at a plurality of positions along the periphery of the base plate 282. Alternatively, the base plate 282 may be fixed to the outer side of process chamber 102.

The base plate 282 has a number of openings 288 at random or in a predetermined arrangement. The base plate 282 is bent in a convex shape so as to absorb a strain due to thermal expansion and prevent generation of particles. The base plate 282 can be formed by a punching metal plate. A diameter of each of the openings 288 is determined based on a harmonic wave of the microwave to be passed therethrough. For example, if the fifth harmonic wave of a 2.45 GHz microwave (the fifth harmonic wave has a frequency of 122.5 GHz (24.5/5) is to be allowed to pass through the microwave blocking member 280, the diameter of each of the openings 288 is set to about 6 mm (122.5/5/4=6.125). It should be noted that the number of order of the harmonic wave is not limited to 5, and any number n can be used. It should be noted that at least one of the nuts 286 may be grounded so as to maintain the base plate 282 at the ground level. Alternatively, the base plate itself may be grounded by contacting a ground line to a side of the base plate 282. It is preferable that the base plate 282 be bent to be in a convex shape or concave shape as mentioned above. However, the bent configuration is not always required.

The microwave blocking member 280 prevents the microwave and the harmonic wave thereof from entering the vacuum pump 108. Especially, before the reaction gas is converted into a plasma, a large amount of microwave is introduced into the process chamber 102 from the microwave generator 110. If such a large amount of microwave enters the vacuum pump, the vacuum pump may run out of control and may be damaged. However, the microwave blocking member 280 blocks the microwave while maintaining vacuum action by the vacuum pump 108. That is, the microwave blocking member 280 can prevent the vacuum pump 108 from being damaged due to the microwave while maintaining a sufficient area of opening provided for the vacuum pump 108. The microwave blocking member 280 protects the vacuum pump 108 irrespective of the presence of the baffle plate 194 shown in FIG. 3.

Figure 15:
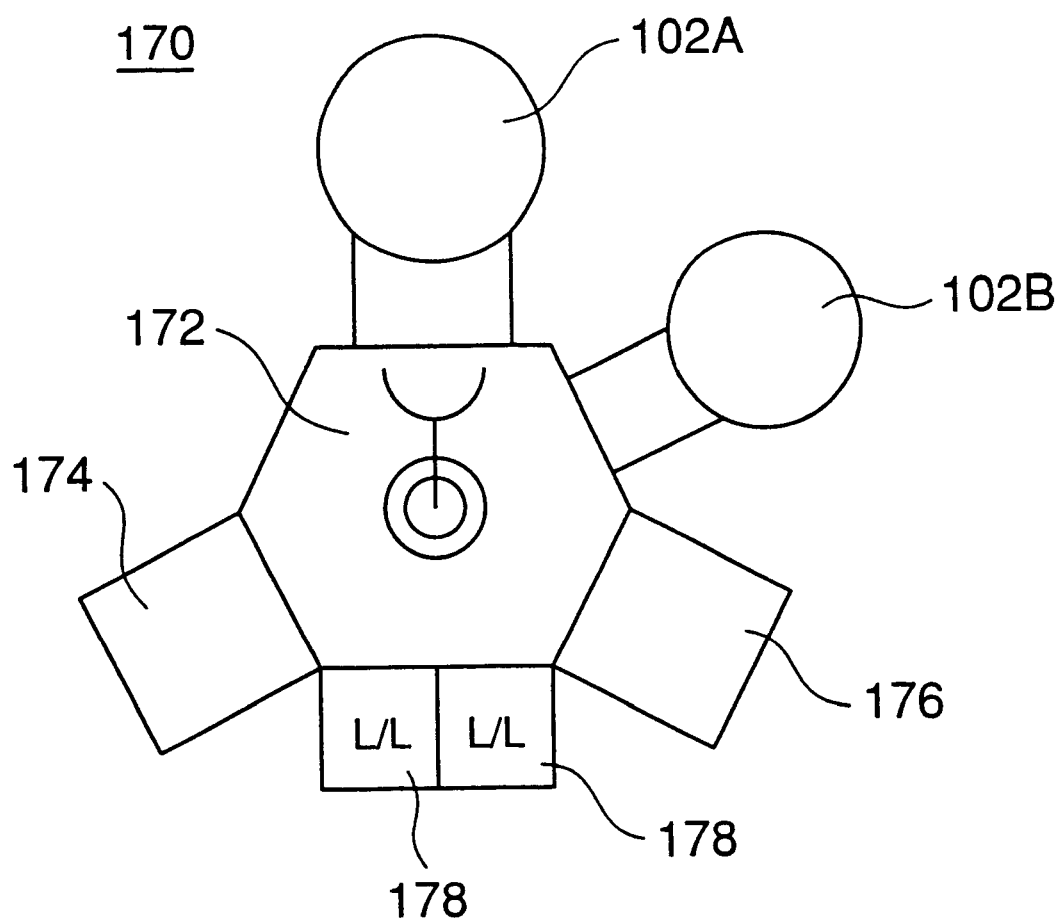
FIG. 15 is an illustration of a structure of a cluster tool to which the microwave plasma processing apparatus shown in FIG. 2 is applied.

A description will now be given, with reference to FIG. 15, of a cluster tool having the microwave plasma processing apparatus 100 serving as a part thereof. FIG. 15 is an illustration of a cluster tool 170 to which the microwave plasma processing apparatus 100 is applied.

As mentioned above, the temperature of the object W can be controlled by the susceptor 104. However, in a CVD process, it takes a considerable time to raise the temperature of the object W from a room temperature to 450° C. by the susceptor 104. In order to eliminate such a problem, the cluster tool 170 heats the object W prior to providing the object W to the process chamber 102 of the microwave plasma processing apparatus 100. Similarly, it takes a considerable time to decrease the temperature of the object W from 450° C. to a room temperature by the susceptor 104 after the plasma processing is completed. In order to eliminate such a problem, the cluster tool 170 cools the object W prior to starting another process after the object W is taken out of the process chamber 102 of the microwave plasma processing apparatus 100.

As shown in FIG. 15, the cluster tool 170 comprises: a conveyor section 172 including a conveyor arm which holds and conveys the object W to be processed; a preheating section 174 for heating the object W; a cooling section 176 for cooling the object W; and load-lock (L/L) chambers 178. In FIG. 15, two process chambers 102A and 102B are shown. Each of the process chambers 102A and 102B can be the process chamber 102 of the microwave plasma processing apparatus 100 shown in FIG. 2. The number of process chambers provided in the cluster tool 170 is not limited to two.

The conveyor section 172 is provided with the conveyor arm which holds the object W and a rotating mechanism for rotating the conveyor arm. The preheating section 174 is provided with a heater so as to heat the object W to a temperature close to a process temperature before the object W is placed in the process chamber 102A or 102B. The cooling section 176 is provided with a cooling chamber which is cooled by a coolant so as to cool the object W taken out of the process chamber 102A or 102B to a room temperature before the object W is conveyed to a subsequent apparatus such as an ion implantation apparatus or an etching apparatus.

Preferably, the cluster tool 170 comprises a rotational angle sensor, a temperature sensor, at least one control unit and a memory for storing control programs so as to control the rotation of the conveyor arm of the conveyor section 172 and control a temperature of each of the preheating section 174 and cooling section 176. Such a sensor, a control unit and a control program are known in the art, and descriptions thereof will be omitted. Additionally, the conveyor arm of the conveyor section 172 places the object W in the process chamber 102A or 102B through the gate valve 179.

A description will now be given of an operation of the microwave plasma processing apparatus 100 shown in FIG. 2.

First, the conveyor arm of the conveyor section 172 shown in FIG. 15 holds the object W to be processed so as to place the object W in the process chamber 102 (in FIG. 15, one of the process chambers 102A and 102B corresponds to the process chamber 102). It is assumed that the object W is subjected to a CVD process in the process chamber 102. In such as case, the control unit (not shown in the figure) of the cluster tool 170 sends an instruction to the conveyor section 172 to heat the object W to a temperature of 450° C. before placing the object W in the process chamber 102.

Upon receiving the instruction, the conveyor section 172 moves the object W to the preheating section 174 so as to heat the object W. When the temperature sensor (not shown in the figure) of the cluster tool 170 detects that the object W to be processed is heated to a temperature of about 450° C., the control unit of the cluster tool 170 sends an instruction to the conveyor section 172 to move the object W to be processed from the preheating section 174 to the process chamber 102 through the gate valve 179. Accordingly, the conveyor arm of the conveyor section 172 conveys the heated object W to the process chamber 102 through the gate valve 179.

When the heated object W reaches a position above the susceptor 104 in the process chamber 102, the vertical moving unit 146 of the lifter pin moving system 140 moves the vertical moving member 142 upward so as to support the object W by the three lifter pins (not shown in the figure) protruding from the upper surface of the susceptor 104. After the object W is transferred from the conveyor arm to the lifter pins, the conveyor arm returns through the gate vale 179. The conveyor arm may be moved to a home position (not shown in the figure).

After the object W is transferred to the lifter pins, the vertical moving unit 146 moves the vertical moving member 142 downward so as to return the lifter pins inside the susceptor 104 and place the object W on the susceptor 104. At this time, the susceptor moving member 142 can be moved while maintaining the hermetic seal of the process chamber 102 by the bellows 144. The susceptor 104 heats the object W placed thereon to a temperature of 450° C. At this time, since the object W is preheated, it takes a short time to completely heat the object W to a desired temperature (450° C.).

Thereafter, the vacuum pump 108 (normally a high-vacuum pump is used) maintains the pressure in the process chamber 102 at 50 mTorr by being controlled by the pressure adjust valve 106. In the microwave plasma processing apparatus 100, since the vacuum pump 108 is positioned directly under the susceptor 104, that is, the opening of the vacuum pump 108 is aligned with the susceptor 104 in a vertical direction in the center of the bottom of the process chamber 102, a uniform evacuation can be achieved in the process chamber 102.

The vertical moving unit 136 of the susceptor moving system 130 moves the susceptor moving member 134 upward so as to move the susceptor 104 and the object W from the home position to a process position at which a predetermined process condition is satisfied. At this time, the susceptor moving member 134 can be moved while hermetic seal of the process chamber 102 is maintained by the bellows 134.

Thereafter, the reaction gas is introduced into the process chamber 102 from the reaction gas source 151 via the mass flow controller 154 and the stop valve 152 while the flow of the reaction gas is controlled. The reaction gas may be a mixture of helium, nitride and hydrogen and $NH_3$ as an additional mixture component.

If the shower plate 220 shown in FIG. 7 is used, the reaction gas is supplied from the reaction gas source 151 to the dielectric material plate 250 via the mass flow controller 154 and the stop valve 152. The reaction gas passes through the gap space 240 shown in FIG. 8 and is introduced into the process chamber 102 via the passage 238 and branch passages 239 of the nozzle member 230. The reaction gas is not converted into plasma in the gap space 240, and is introduced into the process chamber 102 with a uniform density and accurately controlled flow. The process space in the process chamber 102 is maintained at a temperature of about 450° C.

At the same time, a microwave is generated by the microwave generator 110. The microwave is supplied to the wavelength reducing member 124 of the antenna member 120 in a TEM mode via a square waveguide or a coaxial waveguide. The microwave passing through the wavelength reducing member 124 is reduced in its wavelength, and enters the slot electrode 125. The microwave is then introduced into the process chamber 102 via the slits 200 and the dielectric material plate 126. Since a temperature of the wavelength reducing member 124 and the slot electrode 125 is controlled, there is no deformation due to thermal expansion. Accordingly, an optimum length of the slits 200 can be maintained. Thus, the microwave can be introduced into the process chamber 102 at a desired density without local concentration.

Thereafter, the process gas in the process chamber 102 is converted into plasma by the microwave, and a plasma CVD process is performed on the object W placed on the susceptor 104. If the baffle plate 194 shown in FIGS. 3 and 4 is used, the baffle plate 194 maintains the potential in the process space so as to prevent the microwave from exiting the process space. Thus, a desired process speed can be maintained.

If a temperature of the temperature control plate 122 is raised higher than a predetermined upper limit temperature due to continuous use, the temperature control plate 122 is cooled by the temperature control unit 121. On the other hand, if the temperature of the temperature control plate 122 is below a predetermined lower limit temperature at an initial stage of the operation of the apparatus or when the temperature control plate 122 is over cooled, the temperature control unit 121 heats the temperature control plate 122.

The plasma CVD process is continued for a predetermined period of time. Thereafter, the vertical moving unit 136 moves the susceptor moving member 132 downward so as to return the susceptor 104 and the object W to the home position. Then, the object W is taken out of the process chamber 102 by being held by the conveyor arm of the cluster section 172.

Since the microwave is uniformly supplied to the process chamber 102 with a predetermined density, a film having a desired thickness is formed on the object W to be processed. Additionally, since the temperature of the process chamber 102 is maintained in the predetermined range so that a water component (an impurity) does not enter the object W, the deposited film can be maintained at a desired quality.

The object W taken out of the process chamber 102 is transferred to the cooling section 176 and the object W is cooled to a room temperature in a short time. Then, if necessary, the object W is conveyed to a next stage apparatus such as an ion implantation apparatus.

It should be noted that the microwave plasma processing apparatus 100 can utilize an electron cyclotron resonance, and therefore, an electromagnetic coil may be provided so as to generate a magnetic field in the process chamber 102. Additionally, although the microwave plasma processing apparatus 100 according to the present embodiment performs the plasma CVD process as plasma processing, the plasma processing is not limited to the plasma CVD process. That is, for example, a plasma etching process or a plasma ashing or stripping process may be performed by the microwave plasma processing apparatus 100.

Additionally, the object W to be processed by the microwave plasma processing apparatus 100 is not limited to the wafer for producing a semiconductor device, and the microwave plasma processing apparatus 100 may be used to process an LCD substrate or a glass substrate.

The present invention is not limited to the specifically disclosed embodiments, and variations and modifications may be made without departing from the scope of the present invention.

The present application is based on Japanese priority applications No. 11-119002 filed on Apr. 27, 1999 and No. 11-118889 filed on Apr. 27, 1999, the entire contents of which are hereby incorporated by reference.

What is claimed is:

1. A microwave plasma processing apparatus, comprising:
   a process chamber in which an object to be processed is subjected to plasma processing under a predetermined negative pressure environment;
   a susceptor provided in the process chamber, the susceptor being configured to hold the object thereon;
   a susceptor moving member connected to the susceptor;
   a first bellows provided at a bottom of the process chamber off-center therefrom, the first bellows being connected to the susceptor moving member so as to allow a vertical movement of the susceptor moving member while providing a hermetic seal to the process chamber to maintain the predetermined negative pressure environment in the process chamber;
   a susceptor moving mechanism provided outside the process chamber, the susceptor moving mechanism being operable to move the susceptor moving member in the vertical direction within the process chamber; and
   a vacuum pump communicated with the process chamber via an inlet opening at a bottom of the process chamber and at a center portion thereof.

2. The microwave plasma processing apparatus as claimed in claim 1, further comprising:
   an object moving member configured to move the object relative to the susceptor in the vertical direction;
   a second bellows provided at the bottom of the process chamber off-center therefrom, the second bellows being connected to the object moving member so as to allow a vertical movement of the object moving member while providing a hermetic seal between the object moving member and the process chamber to maintain the predetermined negative pressure environment in the process chamber; and
   an object moving mechanism provided outside the process chamber, the object moving mechanism being operable to move the object moving member in the vertical direction within the process chamber.

3. The microwave plasma processing apparatus as claimed in claim 1, further comprising:
   a dielectric material plate positioned above the susceptor, the dielectric material plate having a gas inlet port into which a reaction gas for processing the object is supplied;
   a shower plate mounted to the dielectric material plate so that a gap space having a predetermined width is formed between the dielectric material plate and the shower plate; and
   a plurality of nozzle members provided in the shower plate, each of the nozzle members having a passage through which the reaction gas flows from the gap space to inside the process chamber.

4. The microwave plasma processing apparatus as claimed in claim 3, wherein each of the nozzle members comprises a bolt having the passage extending in a longitudinal direction thereof so that the bolt extends through the shower plate and is fastened to the shower plate by a nut.

5. The microwave plasma processing apparatus as claimed in claim 3, wherein each of the nozzle members comprises a cylindrical member having the passage extending in a longitudinal direction thereof so that the cylindrical member is embedded in the shower plate.

6. The microwave plasma processing apparatus as claimed in claim 3, wherein the passage is branched near an end opening to inside the process chamber.

7. The microwave plasma processing apparatus as claimed in claim 1, wherein the process chamber includes a view port through which the process chamber interior can be observed from outside, the view port being made of a transparent member inserted into a hole formed in a wall of the process chamber from outside the process chamber.

8. The microwave plasma processing apparatus as claimed in claim 7, wherein the view port has a conductive member connected to an inner wall of the hole into which the transparent member is inserted so as to maintain a uniform potential in the process chamber.

9. The microwave plasma processing apparatus as claimed in claim 1, further comprising a baffle plate connected to the susceptor, the baffle plate being made of a conductive material with a plurality of openings so as to maintain the potential in a process space defined in the process chamber.

10. The microwave plasma processing apparatus as claimed in claim 1, further comprising a microwave blocking member provided to the process chamber so as to cover the inlet opening of the vacuum pump so that the microwave is prevented from entering the vacuum pump.

11. The microwave plasma processing apparatus as claimed in claim 10, wherein the microwave blocking member is made of a conductive plate having a plurality of through holes each of which has a predetermined diameter determined based on an nth order harmonic wave of the microwave so that a component of the microwave up to the nth order harmonic wave is prevented from passing through the microwave blocking member.

12. A microwave plasma processing apparatus comprising:

a process chamber in which an object to be processed is subjected to plasma processing under a predetermined negative pressure environment;

a susceptor provided in the process chamber, the susceptor being configured to hold the object thereon;

an object moving member configured to move the object relative to the susceptor in the vertical direction;

a bellows provided at the bottom of the process chamber off-center therefrom, the bellows being connected to the object moving member so as to allow a vertical movement of the object moving member while providing a hermetic seal between the object moving member and the process chamber to maintain the predetermined negative pressure environment in the process chamber;

an object moving mechanism provided outside the process chamber, the object moving mechanism being operable to move the object moving member in the vertical direction within the process chamber; and a vacuum pump communicated with the process chamber via an inlet opening at a bottom of the process chamber and at a center portion thereof.

* * * * *